(12) United States Patent
Park et al.

(10) Patent No.: US 8,927,340 B2
(45) Date of Patent: Jan. 6, 2015

(54) DOUBLE-SIDED ADHESIVE TAPE, SEMICONDUCTOR PACKAGES, AND METHODS OF FABRICATING THE SAME

(71) Applicant: Samsung Electronics Co., Ltd., Suwon-Si, Gyeonggi-Do (KR)

(72) Inventors: Jin-Woo Park, Seoul (KR); Seok-Hyun Lee, Hwaseong-si (KR); Ho-Geon Song, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 80 days.

(21) Appl. No.: 13/772,427

(22) Filed: Feb. 21, 2013

(65) Prior Publication Data

US 2013/0330881 A1 Dec. 12, 2013

(30) Foreign Application Priority Data

Jun. 8, 2012 (KR) ........................ 10-2012-0061745

(51) Int. Cl.
*H01L 21/44* (2006.01)
*H01L 21/50* (2006.01)
*H01L 23/00* (2006.01)

(52) U.S. Cl.
CPC ....... *H01L 21/50* (2013.01); *H01L 2224/48227* (2013.01); *H01L 2924/15311* (2013.01); *H01L 24/96* (2013.01); *H01L 2224/12105* (2013.01); *H01L 2224/32225* (2013.01); *H01L 24/19* (2013.01); *H01L 2224/73265* (2013.01); *H01L 2224/16225* (2013.01); *H01L 24/82* (2013.01); *H01L 2224/73204* (2013.01); *H01L 2924/18161* (2013.01); *H01L 2924/15331* (2013.01); *H01L 2224/04105* (2013.01); *H01L 24/97* (2013.01)

USPC .......................................... 438/118; 438/127

(58) Field of Classification Search
CPC .......... H01L 24/19; H01L 24/97; H01L 21/50
USPC .................................................. 438/118, 127
See application file for complete search history.

(56) References Cited

U.S. PATENT DOCUMENTS 6,451,398 B1 * 9/2002 Sylvester ..................... 428/41.8
6,541,872 B1 * 4/2003 Schrock et al. ............... 257/783

(Continued)

FOREIGN PATENT DOCUMENTS

KR 20100060867 A 6/2010
KR 20100090883 A 8/2010
KR 101008406 B1 1/2011

*Primary Examiner* — Alexander Ghyka
(74) *Attorney, Agent, or Firm* — Harness, Dickey & Pierce, P.L.C.

(57) ABSTRACT

Provided are a double-sided adhesive tape, semiconductor packages, and methods of fabricating the packages. A method of fabricating semiconductor packages includes providing a double-sided adhesive tape on a top surface of a carrier, the double-sided adhesive tape including a first adhesive layer and a second adhesive layer stacked on the first adhesive layer, the first adhesive layer of the double-sided adhesive tape being in contact with the top surface of the carrier, adhering active surfaces of a plurality of semiconductor chips onto the second adhesive layer of the double-sided adhesive tape, separating the first adhesive layer from the second adhesive layer such that the second adhesive layer remains on the active surfaces of the semiconductor chips, patterning the second adhesive layer to form first openings that selectively expose the active surfaces of the semiconductor chips, and forming first conductive components on the second adhesive layer to fill the first openings.

16 Claims, 16 Drawing Sheets

(56) References Cited

U.S. PATENT DOCUMENTS

| | | | |
|---|---|---|---|
| 7,309,623 B2* | 12/2007 | Tan et al. | 438/110 |
| 7,969,026 B2* | 6/2011 | Lytle et al. | 257/787 |
| 2005/0147783 A1* | 7/2005 | Fisher | 428/40.1 |
| 2005/0282306 A1* | 12/2005 | Yamanaka | 438/57 |
| 2007/0121327 A1* | 5/2007 | Chen et al. | 362/294 |
| 2007/0221318 A1* | 9/2007 | Reiss et al. | 156/249 |
| 2010/0314746 A1 | 12/2010 | Hsieh et al. | |
| 2011/0081535 A1 | 4/2011 | Prenzel et al. | |
| 2011/0156239 A1* | 6/2011 | Jin | 257/692 |
| 2012/0247657 A1* | 10/2012 | Yamamoto et al. | 156/249 |

* cited by examiner (a)

(b)

DOUBLE-SIDED ADHESIVE TAPE, SEMICONDUCTOR PACKAGES, AND METHODS OF FABRICATING THE SAME

CROSS-REFERENCE TO RELATED APPLICATION

This application claims priority under 35 U.S.C. §119 to Korean Patent Application No. 10-2012-0061745 filed on Jun. 8, 2012, the disclosure of which is hereby incorporated by reference in its entirety.

BACKGROUND

1. Field

Example embodiments of the inventive concepts relate to an adhesive tape, semiconductor packages, and/or methods of fabricating the same.

2. Description of Related Art

In recent years, with a sharp increase in the capacity of data processed by a large amount of electronic products including various portable information communication devices, such as personal computers (PCs), portable phones, tablet PCs, or personal digital assistants (PDAs), the electronic products have been highly functional, miniaturization and made lightweight.

SUMMARY

At least one example embodiment of the inventive concepts is related to double-sided adhesive tape.

In one example embodiment the double-sided adhesive tape includes a first adhesive layer, and a second adhesive layer stacked on the first adhesive layer.

According to another example embodiment, the double-sided adhesive tape may be interposed between the first adhesive layer and the second adhesive layer, and further include a base film layer having a greater thickness than the first and second adhesive layers.

According to another example embodiment, the double-sided adhesive tape may further include a protection film layer provided on the second adhesive layer.

According to another example embodiment, the double-sided adhesive tape may further include an intermediate layer formed between the second adhesive layer and the base film layer.

According to another example embodiment, the first adhesive layer may include non-photosensitive polyimide.

According to another example embodiment, the second adhesive layer may include photosensitive polyimide.

According to another example embodiment, the base film layer may include non-photosensitive polyimide.

At least one example embodiment of the inventive concepts relates to semiconductor packages.

In one example embodiment, a method of fabricating a semiconductor package includes providing a double-sided adhesive tape on a top surface of a carrier, the double-sided adhesive tape including a first adhesive layer and a second adhesive layer stacked on the first adhesive layer, the first adhesive layer of the double-sided adhesive tape being in contact with the top surface of the carrier; adhering active surfaces of a plurality of semiconductor chips onto the second adhesive layer of the double-sided adhesive tape; separating the first adhesive layer from the second adhesive layer such that the second adhesive layer remains on the active surfaces of the semiconductor chips; patterning the second adhesive layer to form first openings that selectively expose the active surfaces of the semiconductor chips; and forming first conductive components on the second adhesive layer to fill the first openings.

According to another example embodiment, the double-sided adhesive tape may include a base film layer interposed between the first and second adhesive layers.

According to another example embodiment, the base film layer may have a greater thickness than the first and second adhesive layers.

According to another example embodiment, the separation of the first adhesive layer from the second adhesive layer may separate the base film layer from the second adhesive layer.

According to another example embodiment, the first adhesive layer may include non-photosensitive polyimide.

According to another example embodiment, the double-sided adhesive tape may include a protection film layer provided on the second adhesive layer.

According to another example embodiment, when the double-sided adhesive tape is provided on the top surface of the carrier, the method may further include removing the protection film layer from the double-sided adhesive tape.

According to another example embodiment, the double-sided adhesive tape may further include an intermediate layer formed between the second adhesive layer and the base film layer.

According to another example embodiment, the separation of the first adhesive layer from the second adhesive layer may include separating the intermediate layer from the second adhesive layer.

According to another example embodiment, the base film layer may include non-photosensitive polyimide.

According to another example embodiment, the second adhesive layer may include photosensitive polyimide.

According to another example embodiment, the method may further include forming an encapsulation layer in contact with the second adhesive layer to cover the semiconductor chips before separating the first adhesive layer from the second adhesive layer.

According to another example embodiment, the encapsulation layer may include epoxy resin.

According to another example embodiment, the method may further include cutting the encapsulation layer and the second adhesive layer to separate the semiconductor chips from one another.

According to another example embodiment, the forming first conductive components may include selectively exposing and developing the second adhesive layer using a photolithography process.

According to another example embodiment, the method may further include forming a passivation layer on the second adhesive layer and the first conductive components, the passivation layer having second openings exposing portions of the first conductive components; and forming second conductive components on the passivation layer to fill the second openings, the second conductive components being electrically connected to the first conductive components.

According to another example embodiment, the passivation layer may include at least one of a silicon nitride and polyimide.

According to another example embodiment, the second conductive components may include at least one of solder balls and conductive pads.

At least one example embodiment of the inventive concepts relates to fabricating a semiconductor package.

In one example embodiment, a method of fabricating a semiconductor package includes providing a double-sided adhesive tape on one surface of a semiconductor chip, the double-sided adhesive tape including a lower adhesive layer, a base film layer, and a photosensitive adhesive layer stacked sequentially, the photosensitive adhesive layer directly adhered onto the one surface of the semiconductor chip; forming an encapsulation layer on the photosensitive adhesive layer to cover the semiconductor chip; separating the photosensitive adhesive layer from the double-sided adhesive tape such that the photosensitive layer remains on the one surface of the semiconductor chip and the encapsulation layer; forming an opening in the photosensitive adhesive layer using a photolithography process to expose the one surface of the semiconductor chip; and forming a conductive component on the photosensitive adhesive layer to fill the inside of the opening.

At least one example embodiment of the inventive concepts relates to fabricating a semiconductor package.

In one example embodiment, a method of fabricating a semiconductor package may include adhering a first adhesive layer of a double-sided adhesive tape onto a surface of a carrier, the double-sided adhesive tape including the first adhesive layer and a second adhesive layer; adhering an active surface of at least one semiconductor chip onto the second adhesive layer of the double-sided adhesive tape; separating the first adhesive layer from the second adhesive layer such that the second adhesive layer remains on the active surface of the at least one semiconductor chip; and forming first conductive components in the second adhesive layer such that the first conductive components are electrically connected to the at least one semiconductor chip.

According to another example embodiment, the double-sided adhesive tape may include a base film layer interposed between the first and second adhesive layers and separating the first adhesive layer from the second adhesive layer separates the base film layer from the second adhesive layer.

According to another example embodiment, the method further includes forming an encapsulation layer in contact with the second adhesive layer to cover the semiconductor chips before separating the first adhesive layer from the second adhesive layer.

According to another example embodiment, the method further includes forming a passivation layer on the second adhesive layer and the first conductive components, the passivation layer having openings exposing portions of the first conductive components; and forming second conductive components on the passivation layer to fill the openings, the second conductive components being electrically connected to the first conductive components.

Specific particulars of various embodiments are included in detailed descriptions and drawings. Aspects of the present invention should not be limited by the above description, and other unmentioned aspects will be clearly understood by one of ordinary skill in the art from example embodiments described herein.

BRIEF DESCRIPTION OF THE DRAWINGS

The above and other features and advantages will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1A:
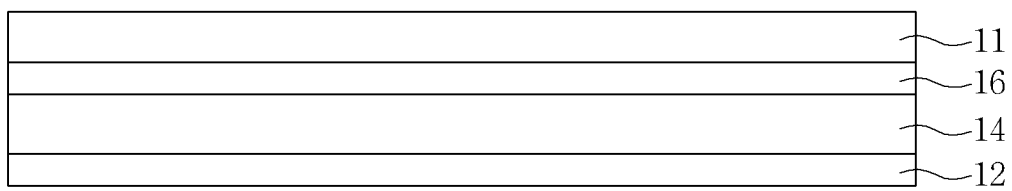
FIGS. 1A and 1B are side views of a double-sided adhesive tape according to an example embodiment of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments in accordance with the present invention will now be described more fully hereinafter with reference to the accompanying drawings. The example embodiments may, however, be embodied in different forms and should not be construed as limited to the embodiments described herein. Rather, these embodiments are provided to fully convey the scope of the inventive concept to one skilled in the art. In the drawings, the sizes and relative sizes of layers and regions are exaggerated for clarity. The terminology, embodiments, and drawings used herein are for the purpose of describing particular embodiments only and are not intended to be limiting of the inventive concepts.

Figure 1B:
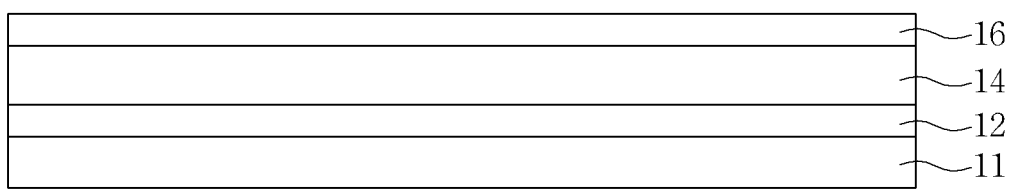

FIGS. 1A and 1B are side views of a double-sided adhesive tape according to various embodiments of the inventive concepts. The thicknesses of each of the layers and regions may be exaggerated in order to improve understanding the present invention.

Referring to FIG. 1A, a double-sided adhesive tape 10a according to an example embodiment of the inventive concepts may include a lower adhesive layer 12, a base film layer 14, a photosensitive adhesive layer 16, and a protective film layer 11 stacked sequentially.

The double-sided adhesive tape 10a, the lower adhesive layer 12 may be formed on a bottom surface of the base film layer 14, and the photosensitive adhesive layer 16 may be stacked on a top surface of the base film layer 14. The protection film layer 11 may be formed on a top surface of the photosensitive adhesive layer 16. The protective film layer 11, which is a release paper, may protect an adhesive surface of the photosensitive adhesive layer 16 and prevent the lower adhesive layer 12 from being in contact with or adhered to the photosensitive adhesive layer 16 in a roll state.

The base film layer 14 may be formed to a greater thickness than the lower adhesive layer 12 and the photosensitive adhesive layer 16. The lower adhesive layer 12 and the photosensitive adhesive layer 16 may have the same thickness. For example, the photosensitive adhesive layer 16 may have a thickness of approximately 5 to 20 micrometers (µm). The lower adhesive layer 12 and the base film layer 14 may include an insulating polymer, for example, non-photosensitive polyimide.

The photosensitive adhesive layer 16 may be separated from the base film layer 14 during a subsequent process, for example, a de-bonding process. The photosensitive adhesive layer 16 may make up for a step difference and differences in physical properties between an encapsulant and semiconductor chips. The photosensitive adhesive layer 16 may serve as an insulating layer between the semiconductor chips and a redistribution layer, as a stress buffer, and as an adhesive to a seed metal. The photosensitive adhesive layer 16 may include photosensitive polyimide (PSPI). The photosensitive adhesive layer 16 may be obtained using various methods, such as a spin coating process or a roll coating process.

Referring to FIG. 1B, a double-sided adhesive tape 10b according to an example embodiment of the inventive concepts may include a protection film layer 11, a lower adhesive layer 12, a base film layer 14, and a photosensitive adhesive layer 16 stacked sequentially. For instance, the protection film layer 11 may be formed on a bottom surface of the lower adhesive layer 12.

Figure 2:
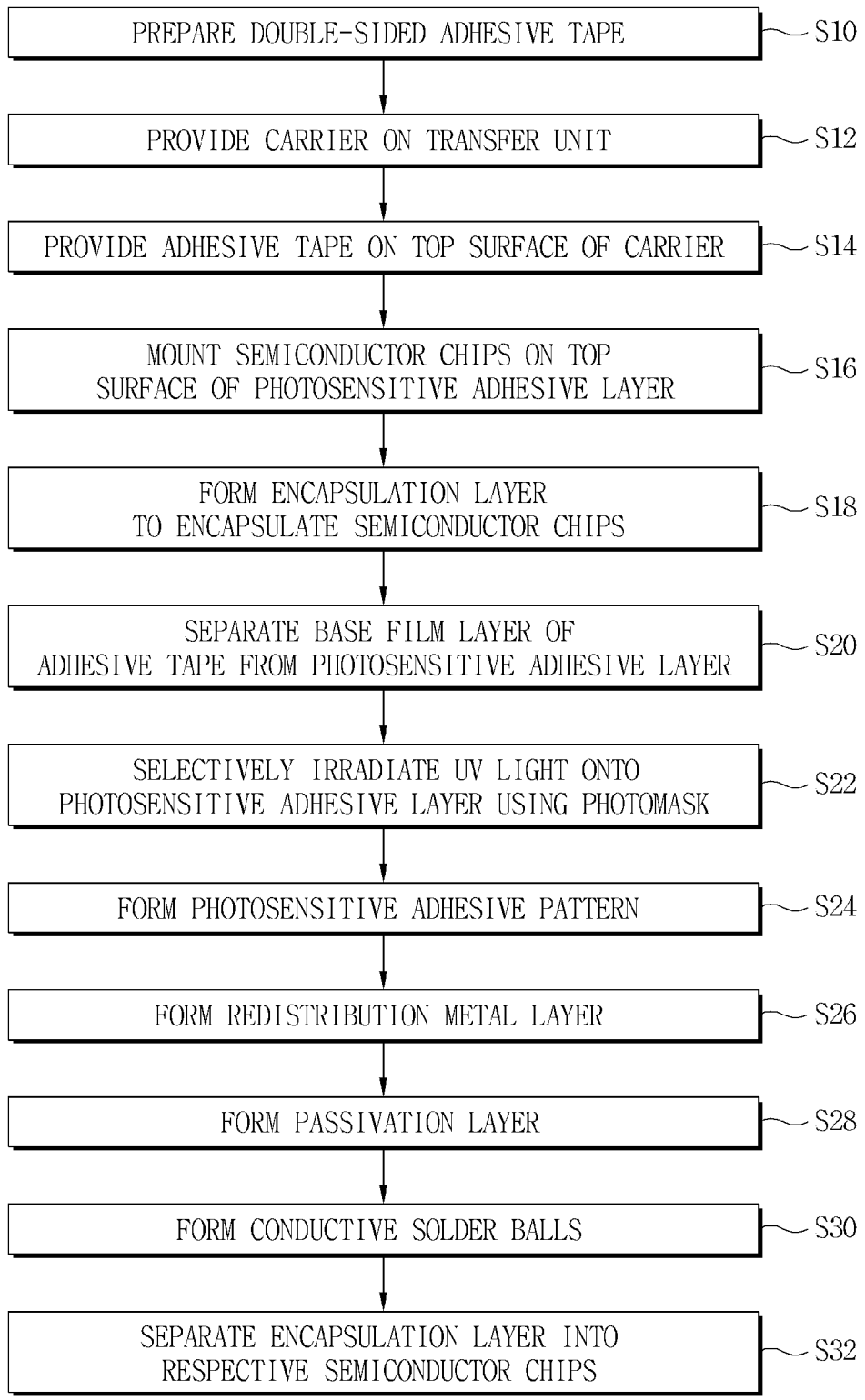
FIG. 2 is a conceptual flow chart illustrating a method of fabricating a semiconductor package according to an example embodiment of the inventive concepts.

FIG. 2 is a conceptual flow chart illustrating a method of fabricating a semiconductor package according to an various embodiments of the inventive concepts, and FIGS. 3A through 3K show conceptual cross-sectional views illustrating a method of fabricating semiconductor packages according to an example embodiment of the inventive concepts.

Referring to FIGS. 2, 1A, and 1B, a method of fabricating semiconductor packages according to an example embodiment of the inventive concepts may include preparing a double-sided adhesive tape 10a or 10b (S10). In FIGS. 3A through 3K, a method of fabricating semiconductor packages using the double-sided adhesive tape 10a including the protection film layer 11 formed on the photosensitive adhesive layer 16 will be exemplarily described.

Figure 3A:
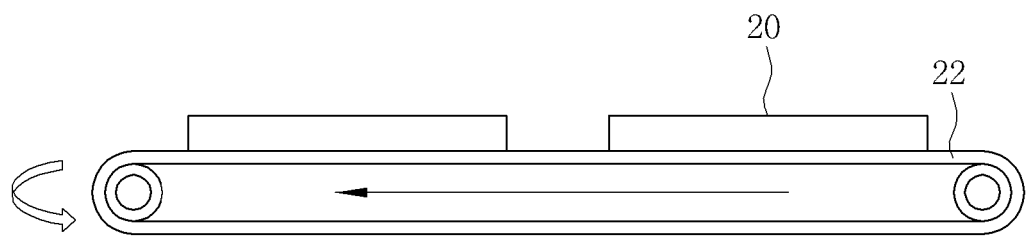
FIGS. 3A through 3K are conceptual cross-sectional views illustrating a method of fabricating semiconductor packages according to an example embodiment of the inventive concepts.

Referring to FIGS. 2 and 3A, the method of fabricating semiconductor packages according to an example embodiment of the inventive concepts may include providing a carrier 20 on a transfer unit 22 (operation S12). In some embodiments, the transfer unit 22 may have an elliptical shape. The carrier 20 may provide a stage configured to adhere the double-sided adhesive tape 10a onto one surface of a semiconductor package. The transfer unit 22 may transfer the carrier 20 to a spot for a subsequent process.

Figure 3B:
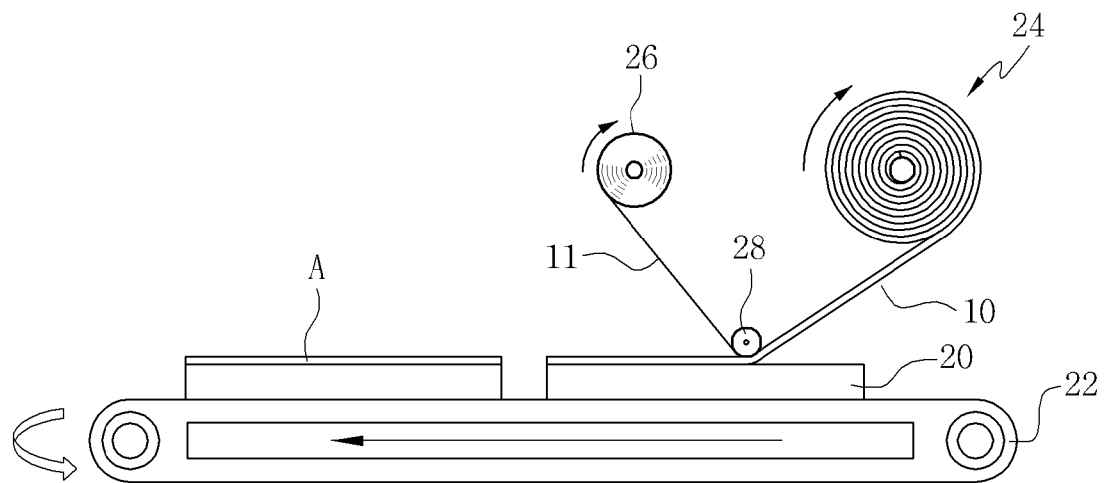
Figure 3B:
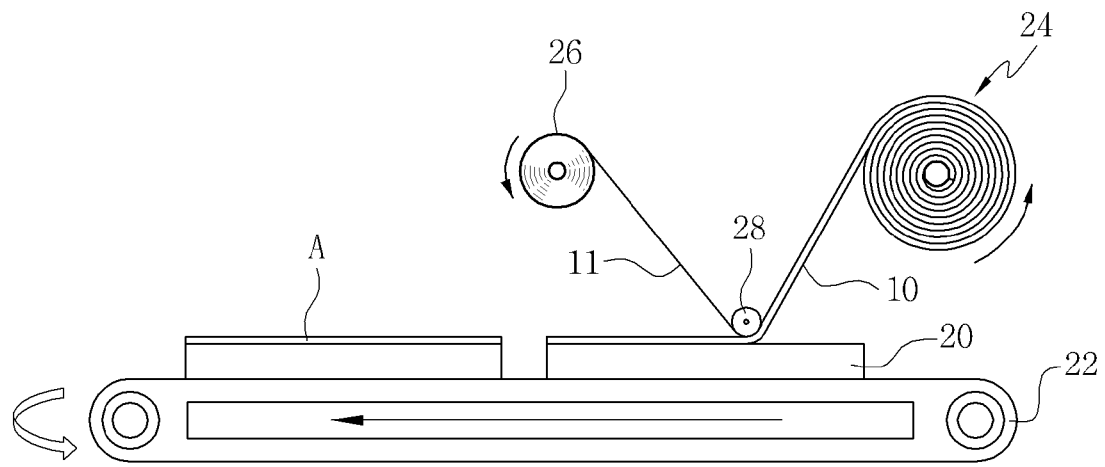

Referring to FIG. 2 and (a) and (b) of FIG. 3B, the method of fabricating semiconductor packages according to an example embodiment of the inventive concepts may include providing an adhesive tape A from which the protection film layer 11 is removed, on a top surface of the carrier 20 using a tape supply roll 24, a tape recovery roll 26, and a press roll 28 (operation S14). The adhesive tape A may include a lower adhesive layer 12, a base film layer 14, and a photosensitive adhesive layer 16 (as shown, for example, in FIG. 1A or 1B). The adhesive tape A provided on the top surface of the carrier 20 may be disposed in a lower position such that the lower adhesive layer 12 is in contact with and adhered to the carrier 20, and the photosensitive adhesive layer 16 may be disposed in an upper position. Referring to (a) of FIG. 3B, the adhesive tape A may be formed on an outer surface of the protection film layer 11. Thus, the tape supply roll 24 may provide a double-sided adhesive tape 10 having the adhesive tape A formed on the outer surface of the protection film layer 11 to the press roll 28. The press roll 28 may apply pressure to the double-sided adhesive tape 10 so that the protection film layer 11 can be separated from the adhesive tape A and provided to the tape recovery roll 26, and the adhesive tap A can be adhered onto the carrier 20. The tape recovery roll 26 may receive the protection film layer 11 from the press roll 28 by winding-up the protection film layer 11. Referring to FIG. 3B (b), the adhesive tape A may be formed on an inner surface of the protection film layer 11.

Figure 3C:
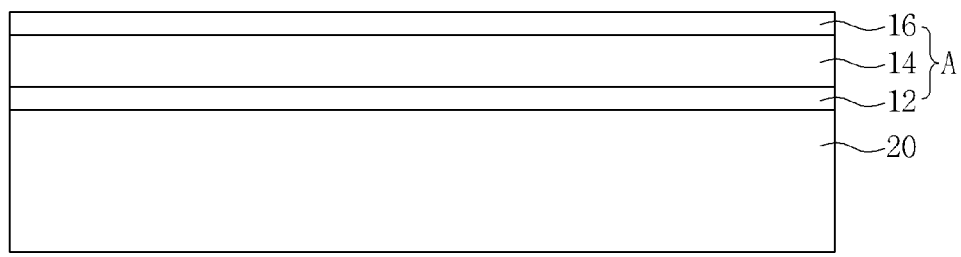

FIG. 3C is an enlarged view of the carrier 20 onto which the double-sided adhesive tape A is adhered, in accordance with an example embodiment of the inventive concepts. Referring to FIG. 3C, the adhesive tape A provided on a top surface of the carrier 20 may include the adhesive layer 12, which may be in contact with and adhered to the surface of the carrier 20, and the photosensitive adhesive layer 16 disposed over the adhesive layer 12.

Figure 3D:
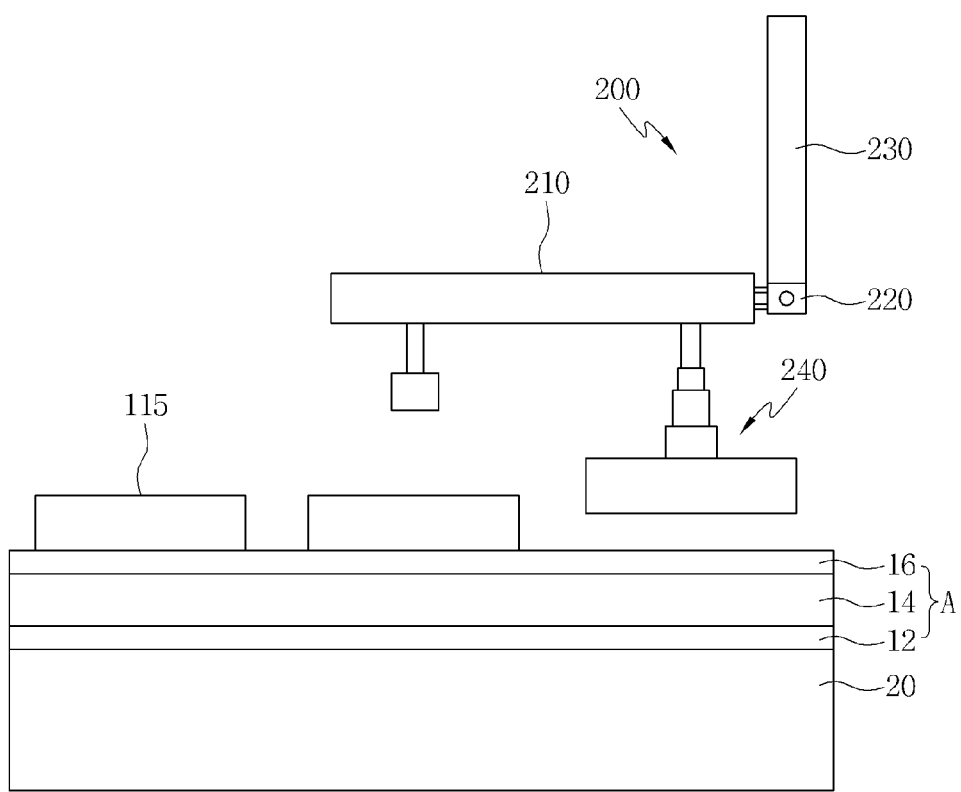

Referring to FIGS. 2 and 3D, the method of fabricating semiconductor packages according to an example embodiment of the inventive concepts may include mounting semiconductor chips 115 on a top surface of the photosensitive adhesive layer 16 using a transfer 200 (operation S16). For instance, active surfaces of the semiconductor chips 115 may be adhered onto the photosensitive adhesive layer 16. Internal circuits may be formed and metal components may be disposed toward the active surfaces of the semiconductor chips 115. The transfer 200 may include a transfer head 210, a rotation axis 220, a driver 230, and nozzles 240 configured to vacuum-suck or otherwise attach to the semiconductor chips 115. Bottom surfaces of the transfer head 210 may be connected to the nozzles 240, and one end portion of the transfer head 210 may be connected to the rotation axis 220. The transfer head 210 may move, for example, up and down or from side to side, so that the semiconductor chips 115 can be transferred or provided to the top surface of the photosensitive adhesive layer 16 using the nozzles 240. In multiple embodiments, the driver 230 may move up and down. The nozzles 240 may be formed on a bottom surface of the transfer head 210 and configured to vacuum-suck or otherwise attach to the semiconductor chips 115. In multiple embodiments, transfer head 210 maybe configured to locate the semiconductor chips 115 on the photosensitive adhesive layer 16. In multiple embodiments, the nozzles 240 may move up and down and pick up and release the semiconductor chips 115 by vacuum suction. The nozzles 240 may be pushed and pulled in a vertical direction towards the ground. The nozzles 240 may be made of a material with elastic and/or soft properties so as to prevent or otherwise mitigate the amount of scratches on the semiconductor chips 115 when semiconductor chips 115 come into contact with the nozzles 240. For example, the nozzles 240 may include urethane rubber, silicone rubber, or other like materials.

Figure 3E:
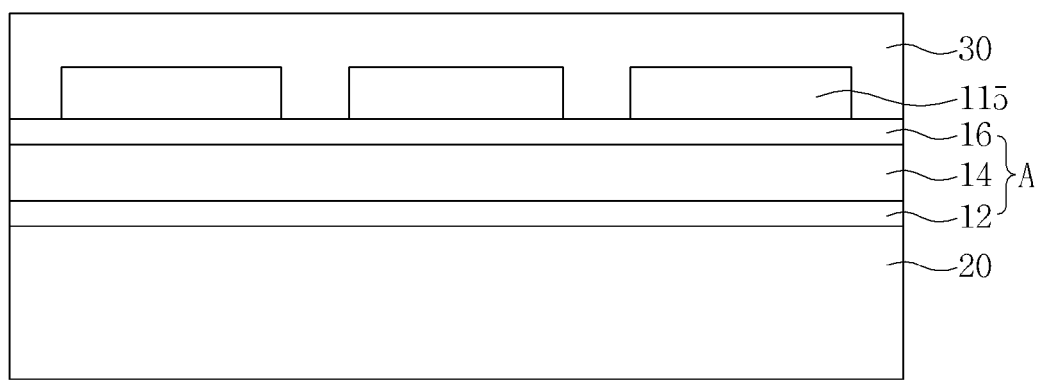

Referring to FIGS. 2 and 3E, the method of fabricating the semiconductor packages according to an example embodiment of the inventive concepts may include forming an encapsulation layer 30 using an encapsulating process of encapsulating the semiconductor chips 115 (operation S18). A method of forming the encapsulation layer 30 may be performed using any one of gel, liquid, powder, and/or other like materials. The encapsulation layer 30 may include resin, such as epoxy and/or other like materials.

Figure 3F:
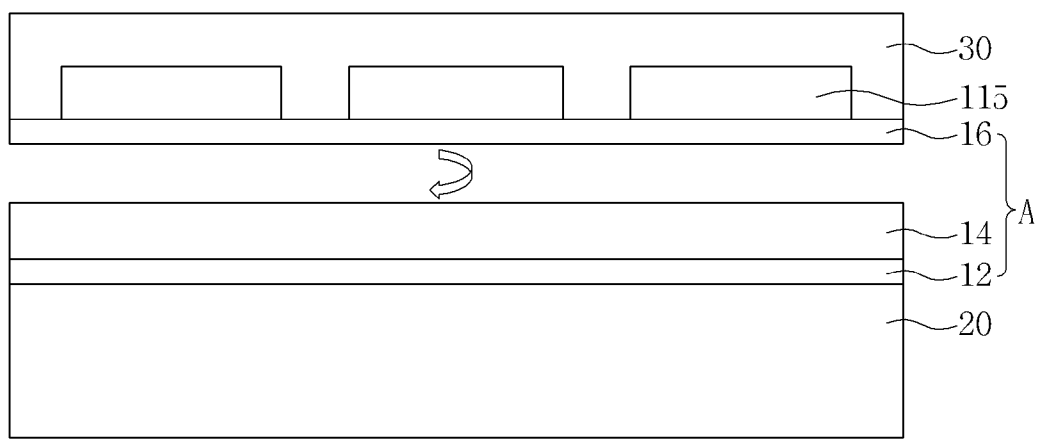

Referring to FIGS. 2 and 3F, the method of fabricating the semiconductor packages according to an example embodiment may include separating the base film layer 14 of the adhesive tape A from the photosensitive adhesive layer 16 using a de-bonding process (S20). For example, by previously forming the photosensitive adhesive layer 16 on one surface of the double-sided adhesive tape 10, the photosensitive adhesive layer 16 formed on the semiconductor chips 115 may be separated from the base film layer 14 after the de-bonding process, and be intactly used during a subsequent process. As a result, a process of forming an additional passivation layer may be omitted, materials may be saved, and/or total assembly time (TAT) may be reduced. Furthermore, thickness uniformity may be improved, and warpage or flection of the encapsulated semiconductor chips 115, which may be problematic during a re-distribution process, may be structurally reduced.

Figure 3G:
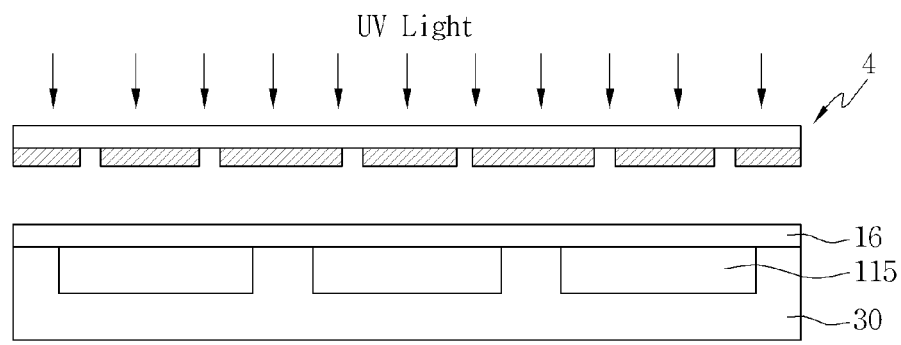

Referring to FIGS. 2 and 3G, the method of fabricating the semiconductor packages according to an example embodiment of the inventive concepts may include performing a photolithography process. For example, the method may include turning the encapsulated semiconductor chips 115 upside down and selectively irradiating ultraviolet (UV) light onto the photosensitive adhesive layer 16 using a photomask 4 (operation S22).

Figure 3H:
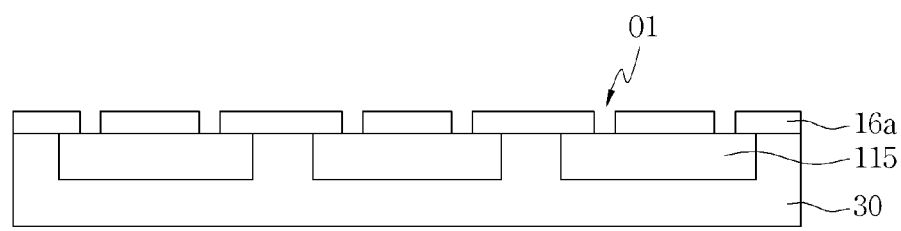

Referring to FIGS. 2 and 3H, the method of fabricating the semiconductor packages according to an example embodiment of the inventive concepts may include forming a photosensitive adhesive pattern 16a (operation S24). In some embodiments, portions of the photosensitive adhesive layer 16 may be irradiated with UV light 5. The portions that are irradiated with UV light 5 may then be removed from the photosensitive adhesive layer 16 using a development process. The photosensitive adhesive pattern 16a may have first openings O1 selectively exposing the semiconductor chips 115. For instance, the first openings O1 may selectively expose uppermost metal layers of the semiconductor chips 115.

Figure 3I:
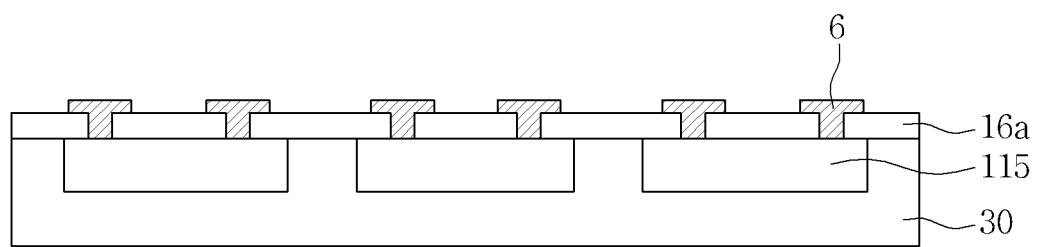

Referring to FIGS. 2 and 3I, the method of fabricating the semiconductor packages according to an example embodiment of the inventive concepts may include forming a redistribution metal layer 6 on the photosensitive adhesive pattern 16a to fill the first openings O1 (operation S26). The redistribution metal layer 6 may include a material having good electrical conductivity (e.g., copper (Cu) and/or other like materials) and be electrically and/or physically connected to an uppermost metal interconnection of the semiconductor chips 115 or through-silicon vias (TSVs).

Figure 3J:
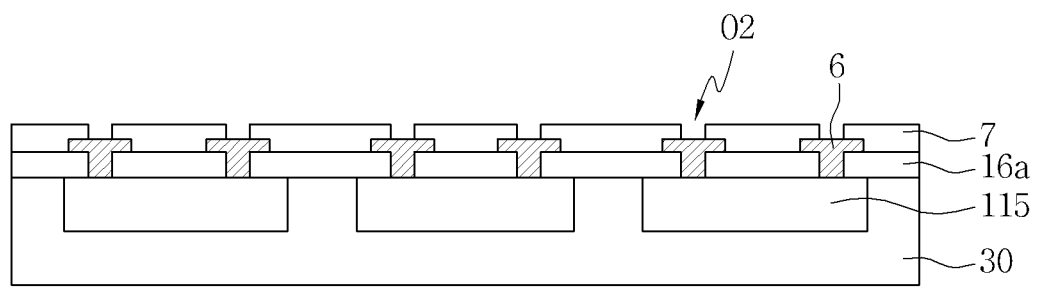

Referring to FIGS. 2 and 3J, the method of fabricating the semiconductor packages according to an example embodiment of the inventive concepts may include forming a passivation layer 7 having second openings O2 to cover the redistribution metal layer 6 and the photosensitive adhesive pattern 16a, and selectively exposing the redistribution metal layer 6 (operation S28). The passivation layer 7 may include silicon nitride or a polymer, such as polyimide, parylene, and/or other like material.

Figure 3K:
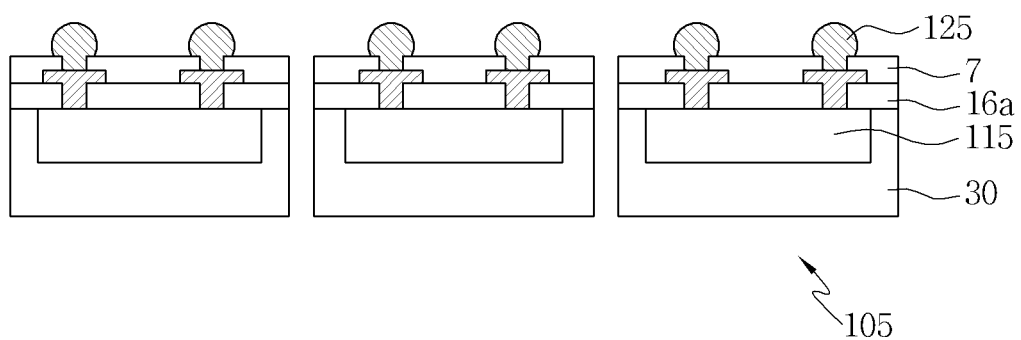

Referring to FIGS. 2 and 3K, the method of fabricating the semiconductor packages may include forming conductive solder balls 125 within the second openings O2 (operation S30).

Referring to FIG. 2, the method of fabricating the semiconductor packages according to an example embodiment of the inventive concepts may include cutting the encapsulation layer 30 using a singulation process into the respective semiconductor chips 115 to form semiconductor packages 105 (operation S32). The singulation process may include a sawing process and/or other like techniques.

In the present embodiment, the redistribution metal layer 6 may be interpreted as input/output (I/O) pads.

Figure 4A:
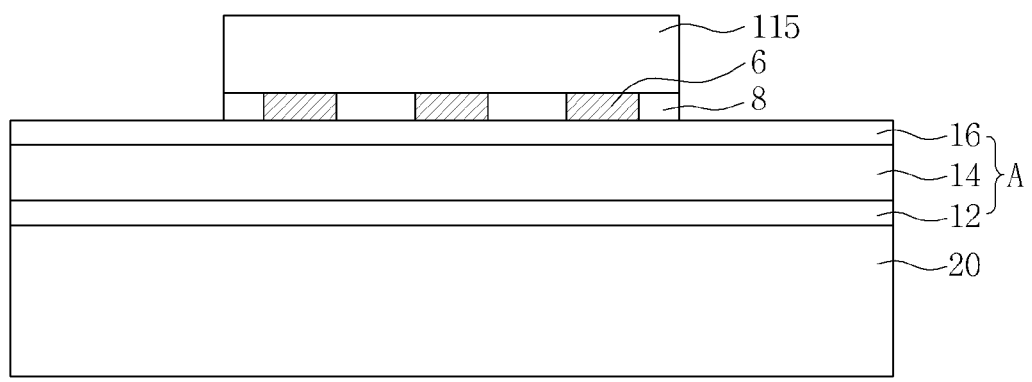
FIGS. 4A through 4C are conceptual cross-sectional views illustrating a method of fabricating semiconductor packages according to an example embodiment of the inventive concepts.
Figure 4B:
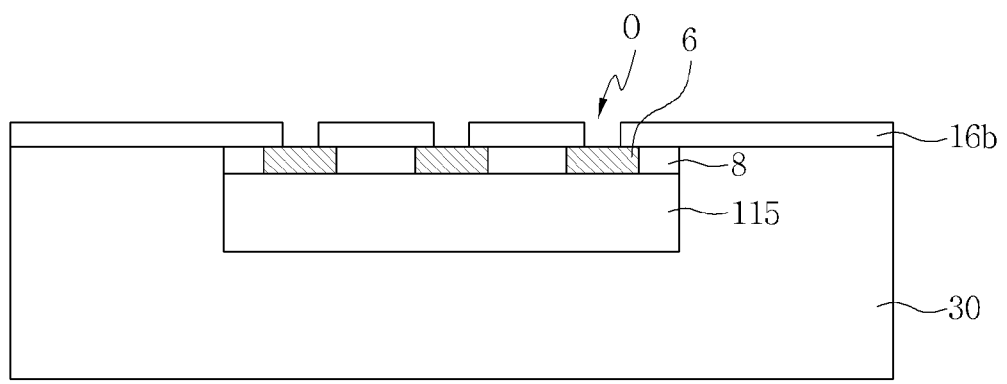
Figure 4C:
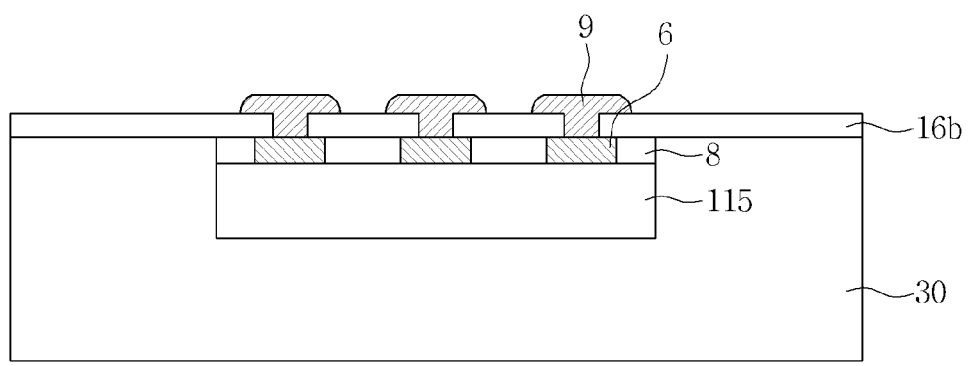

FIGS. 4A through 4C are conceptual cross-sectional views illustrating a method of fabricating semiconductor packages according to various embodiments of the inventive concepts.

Referring to FIG. 4A, fabricating the semiconductor packages according to an example embodiment of the inventive concepts may include adhering a semiconductor chip 115 having a redistribution metal layer 6 onto a top surface of a photosensitive adhesive layer 16 formed on a carrier 20 (with further reference to FIGS. 3A through 3D and descriptions thereof). The redistribution metal layer 6 may be separated and isolated from an insulating layer 8. Top surfaces of the redistribution metal layer 6 and the insulating layer 8 may be planarized. The insulating layer 8 may include silicon oxide, silicon nitride, or polyimide.

Referring to FIG. 4B, the method of fabricating the semiconductor packages according to an example embodiment of the inventive concepts may include encapsulating the semiconductor chip 115 with an encapsulation layer 30, turning the semiconductor chip 115 upside down, and forming a photosensitive adhesive pattern 16b using a photolithography process (with further reference to FIGS. 3E through 3H and descriptions thereof). The photosensitive adhesive pattern 16b may have openings O selectively exposing the redistribution metal layer 6.

Referring to FIG. 4C, the method of fabrication the semiconductor packages according to an example embodiment may include forming bumps 9 to fill the openings O and be electrically connected to the redistribution metal layer 6. The bumps 9 may include solder balls, metal patterns, etc.

Figure 5A:
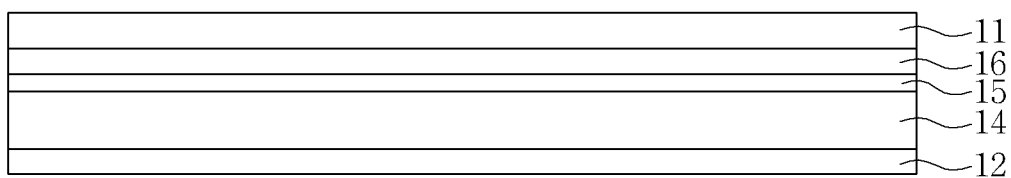
FIGS. 5A and 5B are side views of double-sided adhesive tapes according to example embodiments of the inventive concepts.
Figure 5B:
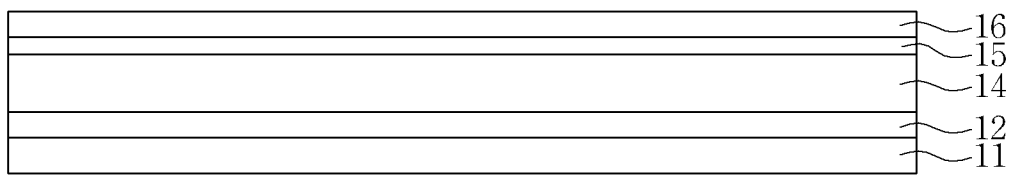

FIGS. 5A and 5B are side views of double-sided adhesive tapes according to various embodiments of the inventive concepts.

Referring to FIG. 5A, a double-sided adhesive tape 10c according to an example embodiment of the inventive concepts may include a lower adhesive layer 12, a base film layer 14, an intermediate layer 15, a photosensitive adhesive layer 16, and a protection film layer 11, which are stacked sequentially.

Referring to FIG. 5B, a double-sided adhesive tape 10d according to an example embodiment of the inventive concepts may include a protection film layer 11, a lower adhesive layer 12, a base film layer 14, an intermediate layer 15, and a photosensitive adhesive layer 16, which are stacked sequentially. The intermediate layer 15 may be easily separated from the photosensitive adhesive layer 16. The intermediate layer 15 may have a hydrophobic surface, an oleophobic surface, an oil-repellent surface, or other like surface. The intermediate layer 15 may include polyimide or resin.

Figure 6A:
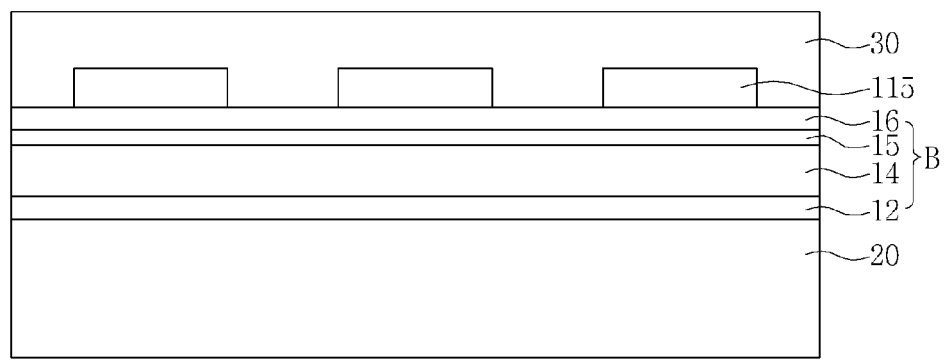
FIGS. 6A and 6B are conceptual side views illustrating a method of fabricating semiconductor packages according to an example embodiment of the inventive concepts.
Figure 6B:
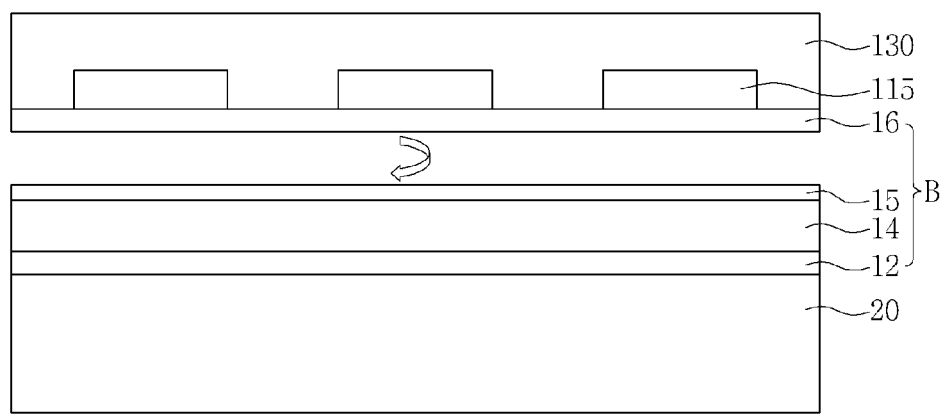

FIGS. 6A and 6B are conceptual side views illustrating a method of fabricating semiconductor packages according to various embodiments of the inventive concepts.

Referring to FIG. 6A, the method of fabricating the semiconductor packages according to an example embodiment of the inventive concepts may include providing an adhesive tape B having an intermediate layer 15 on a carrier 20, mounting a semiconductor chip 115 on the adhesive tape B, and forming an encapsulation layer 30 to encapsulate the semiconductor chip 115. Referring to FIG. 6B, the method of fabricating the semiconductor packages according to an example embodiment of the inventive concepts may include separating the intermediate layer 15 of the adhesive tape B from the photosensitive adhesive layer 16 using a de-bonding process. Thereafter, the processes described with reference to FIGS. 3G through 3K may be performed.

Figure 7:
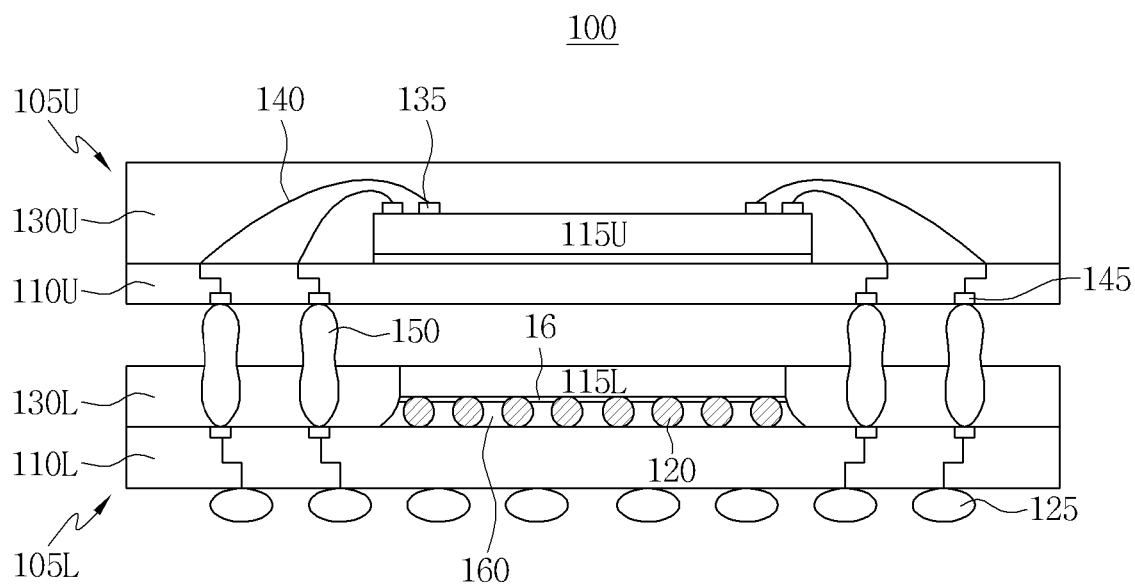
FIG. 7 is a schematic cross-sectional view of a semiconductor package stack structure according to an example embodiment of the inventive concepts.

FIG. 7 is a schematic cross-sectional view of a semiconductor package stack structure according to various embodiments of the inventive concepts. A semiconductor package stack structure 100 according to an example embodiment of the inventive concepts may include a fan-out wafer-level package (WLP).

Referring to FIG. 7, the semiconductor package stack structure 100 according to an example embodiment of the inventive concepts may include a lower semiconductor package 105L, an upper semiconductor package 105U, and inter-package bumps 150 configured to electrically connect the lower and upper semiconductor packages 105L and 105U.

The lower semiconductor package 105L may include a lower package substrate 110L, a lower semiconductor chip 115L, conductive chip bumps 120, and a lower molding compound 130L. The lower package substrate 110L may be a package substrate, for example, a printed circuit board (PCB), a ceramic substrate, or other like substrate.

The lower semiconductor chip 115L may be a logic device, such as a microprocessor (MP) or other like device. The lower semiconductor chip 115L may be disposed on one surface of the lower package substrate 110L. A flip-chip technique may be applied to the lower package 105L. The lower semiconductor chip 115L may be electrically connected to conductive solder balls 125 through conductive chip bumps 120. That is, the lower semiconductor chip 115L may include a flip-chip connection structure having a grid array.

The conductive chip bumps 120 may be disposed between the lower package substrate 110L and the lower semiconductor chip 115L. The conductive chip bumps 120 may electrically connect the lower package substrate 110L and the lower semiconductor chip 115L. The conductive chip bumps 120 may be formed using a soldering process.

An under-fill material 160 and/or a photosensitive adhesive layer 16 may be formed to surround the conductive chip bumps 120 between the lower package substrate 110L and the lower semiconductor chip 115L. The under-fill material 160 may include resin, such as epoxy or other like material. The photosensitive adhesive layer 16 may include photosensitive polyimide.

The conductive solder balls 125 may be components configured to electrically connect the semiconductor package stack structure 100 with a module board or a main circuit board.

The lower molding compound 130L may be formed to surround the chip bumps 120. The lower molding compound 130L may be formed to surround a side surface of the lower semiconductor chip 115L. Additionally, the lower molding compound 130L may be formed to surround side surfaces of the inter-package bumps 150. A top surface of the lower semiconductor chip 115L may not be covered with the lower molding compound 130L. That is, the top surface of the lower semiconductor chip 115L may be exposed. In addition, a top surface of the lower molding compound 130L may be at substantially the same level as the top surface of the lower semiconductor chip 115L. When the top surface of the lower semiconductor chip 115L is exposed, physical properties of the lower semiconductor package 105L may be improved. For example, since the overall thickness of the lower semiconductor package 105L is reduced, heat dissipation characteristics may be improved, and the package stack structure 100 may be thinned out. This may also improve resistance to warpage or flection, thereby enhancing the flatness of the lower package substrate 105L and the lower semiconductor chip 115L. Also, since physical pressure may be directly applied to one surface of the lower semiconductor chip 115L without passing through a molding compound, a grid array technique or a multilayered molding technique may be stably applied. The lower molding compound 130L may contain resin, such as epoxy or other like material.

The upper semiconductor package 105U may include an upper package substrate 110U and an upper semiconductor chip 115U. The upper package substrate 110U may be a package substrate, for example, a printed circuit board (PCB), a ceramic substrate, or other like substrate.

The upper semiconductor chip 115U may be a memory semiconductor device, such as a dynamic random access memory (DRAM) device or a flash memory device. The upper semiconductor chip 115U may be disposed on one surface of the upper package substrate 110. The upper semiconductor chip 115U may be electrically connected to the upper package substrate 110U using bonding pads 135, bonding wires 140, and wire pads 145.

The bonding pads 135 may be formed on a top surface of the upper semiconductor chip 115U. The wire pads 145 may be formed on the upper package substrate 110U. The bonding wires 140 may electrically connect the bonding pads 135 with the wire pads 145, respectively.

The upper semiconductor chip 115U may be covered with an upper molding compound 130U. The upper molding compound 130U may include resin, such as epoxy.

Figure 8A:
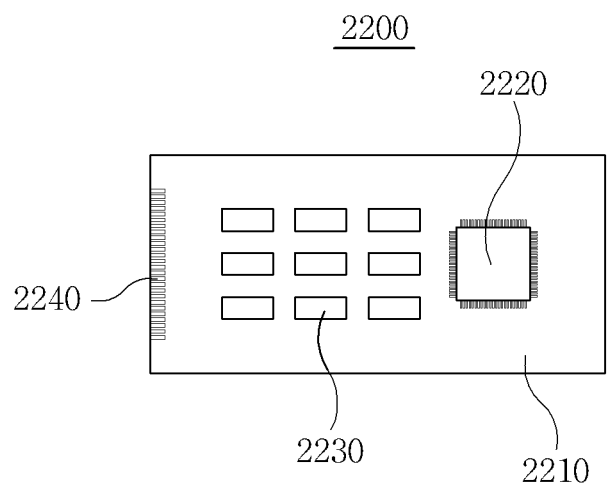
FIGS. 8A through 8D are conceptual diagrams of a semiconductor module, electronic systems, and a mobile device according to example embodiments of the inventive concepts.

FIG. 8A is a conceptual diagram of a semiconductor module 220 including at least one of the semiconductor packages 105 according to various embodiments of the inventive concepts. Referring to FIG. 8A, the semiconductor module 2200 according to an example embodiment of the inventive concepts may include one of the semiconductor packages 105 according to various embodiments of the inventive concepts, as described above, which may be mounted on a semiconductor module substrate 2210. The semiconductor module 220 may further include a microprocessor (MP) 2220 mounted on the module substrate 2210. Input/output (I/O) terminals 2240 may be disposed at one side of the module substrate 2210.

Figure 8B:
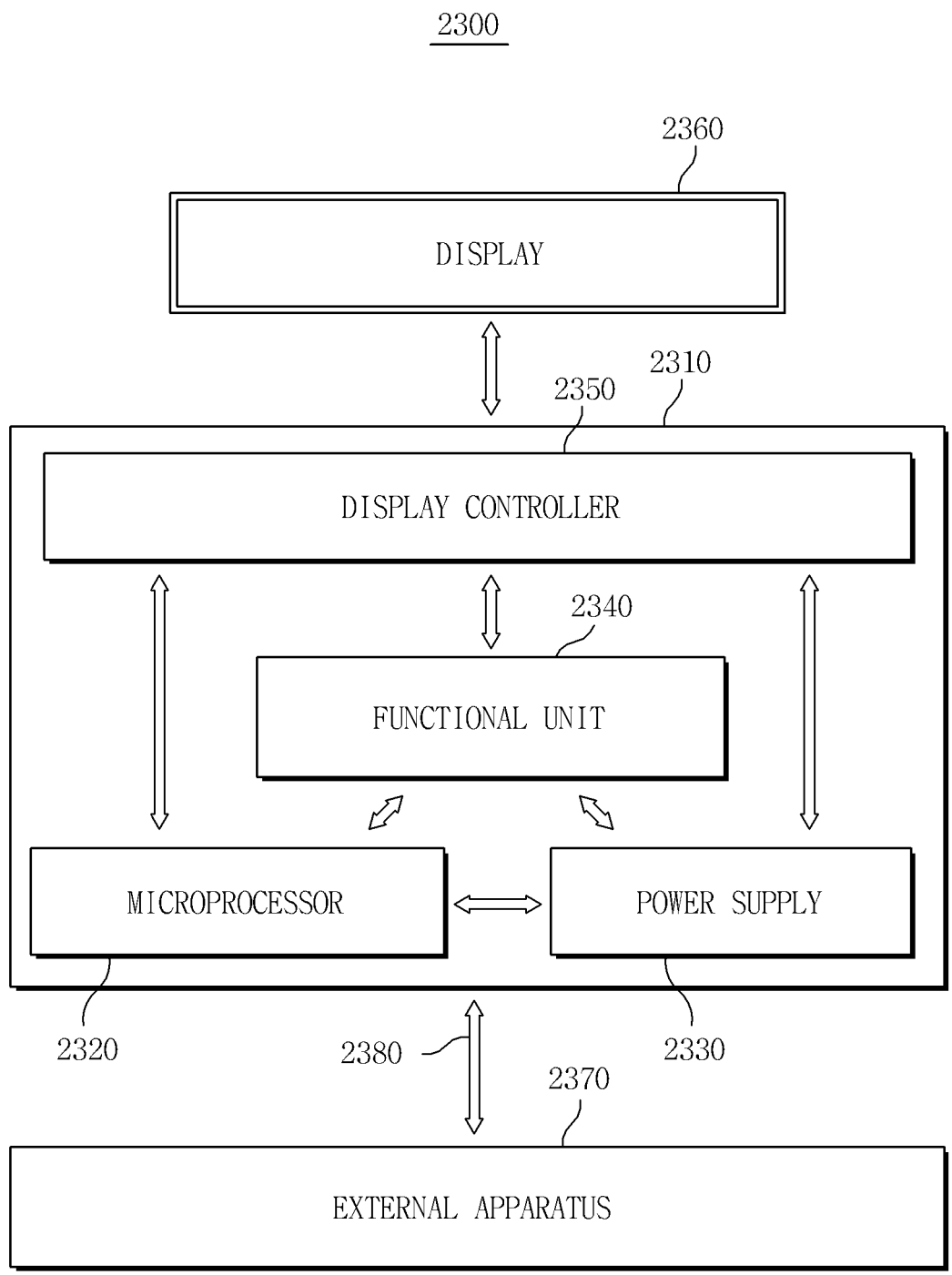

FIG. 8B is a conceptual block diagram of an electronic system 2300 including at least one of the semiconductor packages 105 according to various embodiments of the inventive concepts. Referring to FIG. 8B, the semiconductor packages 105 according to various embodiments as described above of the inventive concepts may be applied to the electronic system 2300. The electronic system 2300 may include a body 2310. The body 2310 may include an MP 2320, a power supply 2330, a function unit 2340, and/or a display controller 2350. The body 2310 may be a system board or mother board including a PCB. The MP unit 2320, the power supply 2330, the function unit 2340, and the display controller unit 2350 may be mounted on the body 2310. The display unit 2360 may be disposed on a top surface of the body 2310 or outside the body 2310. For example, the display unit 2360 may be disposed on the surface of the body 2310 and display an image processed by the display controller unit 2350. The power supply 2330 may function to receive a predetermined voltage from an external battery (not shown), divide the voltage into various voltage levels, and supply the divided voltages to the MP unit 2320, the function unit 2340, and the display controller unit 2350. The MP unit 2320 may receive a voltage from the power supply 2330 and control the function unit 2340 and the display unit 2360. The function unit 2340 may serve various functions of the electronic system 2300. For example, when the electronic system 2300 is a mobile electronic device, (e.g., a portable phone, tablet personal computer (PC), or other like device) the function unit 2340 may include several components capable of serving wireless communication functions, for example, outputting an image to the display unit 2360 or outputting a voice to a speaker, by dialing or communicating with an external apparatus 2370. In various embodiments, a camera may be mounted to electronic system 2300. When a camera is mounted, the function unit 2340 may serve as a camera image processor. In another embodiment, when the electronic system 2300 is connected to a memory card to increase capacity, the function unit 2340 may be a memory card controller. The function unit 2340 may transmit/receive signals to/from the external apparatus 2370 through a wired or wireless communication unit 2380. Furthermore, when the electronic system 2300 requires a universal serial bus (USB) to increase functionality, the function unit 2340 may serve as an interface controller. The semiconductor devices 10a to 10d according to various embodiments of the inventive concepts may be included in at least one of the MP unit 2320 and the function unit 2340.

Figure 8C:
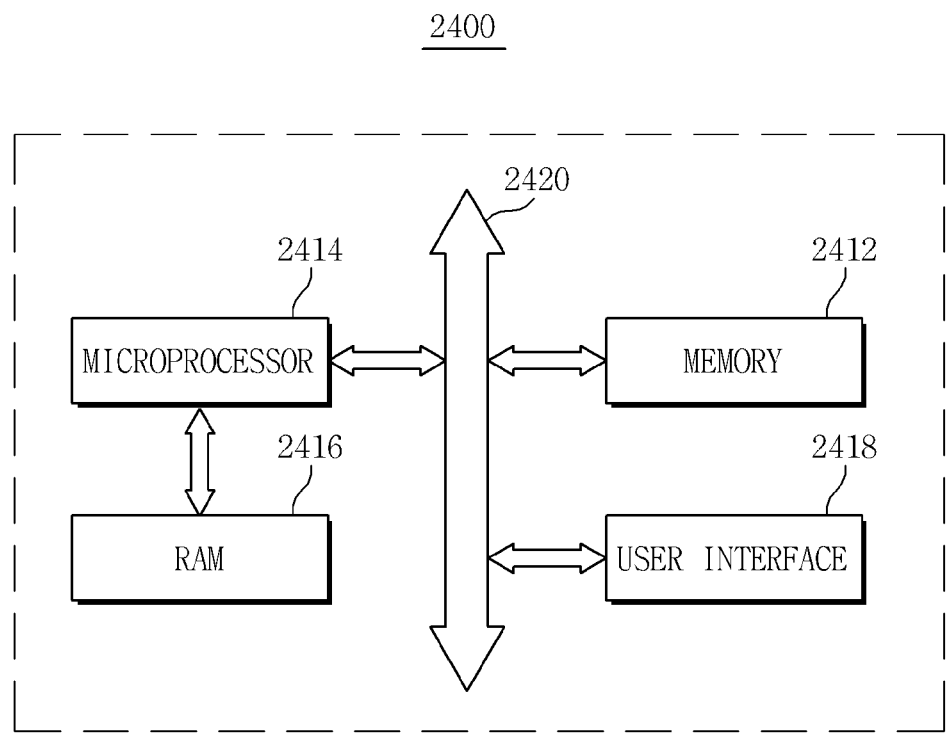

FIG. 8C is a schematic block diagram of another electronic system 2400 including at least one of semiconductor packages 105, according to an embodiment of the inventive concepts. Referring to FIG. 8C, the electronic system 2400 may include at least one of the semiconductor packages 105 according to the various example embodiments of the inventive concepts. The electronic system 2400 may be used to fabricate a mobile device or a computer. For example, the electronic system 2400 may include a memory system 2412, an MP 2414, a random access memory (RAM) 2416, and a user interface 2418 configured to communicate data using a bus 2420. The MP 2414 may program and control the electronic system 2400. The RAM 2416 may be used as an operation memory of the MP 2414. The MP 2414 or the RAM 2416 may include at least one of the semiconductor packages 105 according to the embodiments of the inventive concept. The MP 2414, the RAM 2416, and/or other elements may be assembled within a single package. The user interface 2418 may be used to input data to the electronic system 2400 or output data from the electronic system 2400. The memory system 2412 may store codes for operating the MP 2414, data processed by the MP 2414, or external input data. The memory system 2412 may include a controller and a memory.

Figure 8D:
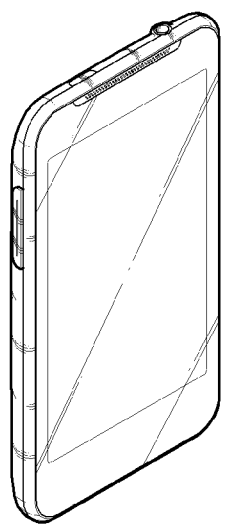

FIG. 8D is a schematic diagram of a mobile wireless phone 2500 including at least one of the semiconductor packages 105 according to various embodiments of the inventive concepts. The mobile wireless phone 2500 may be interpreted as a tablet PC or other like mobile device. In addition, at least one of the semiconductor packages 105 according to various embodiments of the inventive concepts may be used not only for a mobile phone or a tablet PC but also for a portable computer such as a laptop computer, an MPEG-1 audio layer 3 (MP3) player, an MP4 player, a navigation device, a solid-state disk (SSD), a desktop computer, electronic devices for automotive and household uses, or other like devices.

According to a double-sided adhesive tape, a semiconductor package, and methods of fabricating the same according to various embodiments of the inventive concept, a photosensitive adhesive having both surfaces on which adhesive layers are formed can be provided in a fan-out wafer-level package (WLP) process so that a photosensitive adhesive layer can be used as it is after a de-bonding process. That is, a process of forming polyimide can be omitted, materials can be saved, and total assembly time (TAT) can be reduced. Furthermore, the thickness of a package can be uniformized, flection or warpage of an encapsulated chip, which are problematic in a redistribution process, can be structurally reduced, thereby facilitating the entire process.

The foregoing is illustrative of embodiments and is not to be construed as limiting thereof. Although a few embodiments have been described, those skilled in the art will readily appreciate that many modifications are possible without materially departing from the intended spirit and scope of example embodiments. Accordingly, all such modifications as would be obvious to one skilled in the art are intended to be included within the scope of the following claims. In the claims, means-plus-function clauses are intended to cover the structures described herein as performing the recited function, and not only structural equivalents but also equivalent structures.

What is claimed is:

1. A method of fabricating a semiconductor package, comprising:

providing a double-sided adhesive tape on a top surface of a carrier, the double-sided adhesive tape including a first adhesive layer and a second adhesive layer stacked on the first adhesive layer, the first adhesive layer of the double-sided adhesive tape being in contact with the top surface of the carrier;

adhering active surfaces of a plurality of semiconductor chips onto the second adhesive layer of the double-sided adhesive tape;

separating the first adhesive layer from the second adhesive layer such that the second adhesive layer remains on the active surfaces of the semiconductor chips;

patterning the second adhesive layer to form first openings that selectively expose the active surfaces of the semiconductor chips; and forming first conductive components on the second adhesive layer to fill the first openings.

2. The method of claim 1, wherein the double-sided adhesive tape comprises a base film layer interposed between the first and second adhesive layers, and separating the first adhesive layer from the second adhesive layer separates the base film layer from the second adhesive layer.

3. The method of claim 2, wherein the base film layer has a greater thickness than the first and second adhesive layers.

4. The method of claim 3, wherein the first adhesive layer includes non-photosensitive polyimide.

5. The method of claim 2, wherein the double-sided adhesive tape comprises a protection film layer provided on the second adhesive layer, and the method further comprises:

removing the protection film layer from the double-sided adhesive tape when the double-sided adhesive tape is provided on the top surface of the carrier.

6. The method of claim 2, wherein the double-sided adhesive tape comprises an intermediate layer formed between the second adhesive layer and the base film layer, and separating the first adhesive layer from the second adhesive layer separates the intermediate layer from the second adhesive layer.

7. The method of claim 2, wherein the base film layer includes non-photosensitive polyimide.

8. The method of claim 1, wherein the second adhesive layer includes photosensitive polyimide.

9. The method of claim 1, further comprising:

forming an encapsulation layer in contact with the second adhesive layer to cover the semiconductor chips before separating the first adhesive layer from the second adhesive layer.

10. The method of claim 9, wherein the encapsulation layer includes epoxy resin.

11. The method of claim 9, further comprising:

cutting the encapsulation layer and the second adhesive layer to separate the semiconductor chips from one another.

12. The method of claim 1, wherein the forming first conductive components comprises selectively exposing and developing the second adhesive layer using a photolithography process.

13. The method of claim 1, further comprising:

forming a passivation layer on the second adhesive layer and the first conductive components, the passivation layer having second openings exposing portions of the first conductive components; and forming second conductive components on the passivation layer to fill the second openings, the second conductive components being electrically connected to the first conductive components.

14. The method of claim 13, wherein the passivation layer includes at least one of silicon nitride and polyimide.

15. The method of claim 13, wherein the second conductive components include at least one of solder balls and conductive pads.

16. A method of fabricating a semiconductor package, comprising:

providing a double-sided adhesive tape on one surface of a semiconductor chip, the double-sided adhesive tape including a lower adhesive layer, a base film layer, and a photosensitive adhesive layer stacked sequentially, the photosensitive adhesive layer directly adhered onto the one surface of the semiconductor chip;

forming an encapsulation layer on the photosensitive adhesive layer to cover the semiconductor chip;

separating the photosensitive adhesive layer from the double-sided adhesive tape such that the photosensitive layer remains on the one surface of the semiconductor chip and the encapsulation layer;

forming an opening in the photosensitive adhesive layer using a photolithography process to expose the one surface of the semiconductor chip; and forming a conductive component on the photosensitive adhesive layer to fill the inside of the opening.

* * * * *